(12) United States Patent
Lu

(10) Patent No.: US 6,781,833 B2
(45) Date of Patent: Aug. 24, 2004

(54) HEAT DISSIPATION CONNECTOR WITH USB PORT

(76) Inventor: Wen-Hua Lu, 7F, No. 1226-6 Chung Cheng Rd., Taoyuan (TW)

(*) Notice: Subject to any disclaimer, the term of this patent is extended or adjusted under 35 U.S.C. 154(b) by 24 days.

(21) Appl. No.: 10/132,314

(22) Filed: Apr. 26, 2002

(65) Prior Publication Data

US 2003/0174467 A1 Sep. 18, 2003

(30) Foreign Application Priority Data

Mar. 13, 2002 (TW) ........................................ 091202954

(51) Int. Cl.[7] ............................................... H05K 7/20
(52) U.S. Cl. ...................... 361/695; 165/80.3; 165/121; 165/126; 361/715; 361/756; 454/184; 320/115
(58) Field of Search ........................ 165/80.3, 121–126; 361/687, 694–695, 715, 801–803, 728–730, 752, 756, 758; 454/184; 320/115, 163; 415/53, 423.14, 423.15, 360, 119

(56) References Cited

U.S. PATENT DOCUMENTS

| | | | |
|---|---|---|---|
| 4,751,872 A | * | 6/1988 | Lawson, Jr. ................. 361/695 |
| 4,767,262 A | * | 8/1988 | Simon ......................... 361/695 |
| 5,557,500 A | | 9/1996 | Baucom et al. |
| 5,596,483 A | | 1/1997 | Wyler |
| 5,613,906 A | | 3/1997 | Kikinis |
| 5,729,431 A | | 3/1998 | Marwah et al. |
| 5,831,822 A | | 11/1998 | Hulick et al. |
| 5,862,037 A | * | 1/1999 | Behl ........................... 361/687 |
| 5,898,568 A | | 4/1999 | Cheng |
| 6,034,871 A | | 3/2000 | Cheng |
| 6,071,082 A | * | 6/2000 | Lecinski et al. ............ 361/695 |
| 6,144,554 A | | 11/2000 | Mok |
| 6,169,656 B1 | | 1/2001 | Pei et al. |
| 6,170,563 B1 | | 1/2001 | Hsieh |
| 6,181,553 B1 | | 1/2001 | Cipolla et al. |
| 6,211,649 B1 | * | 4/2001 | Matsuda ..................... 320/115 |
| 6,239,971 B1 | | 5/2001 | Yu |
| 6,257,930 B1 | | 7/2001 | Yu |
| 6,324,605 B1 | | 11/2001 | Rafferty et al. |
| 6,362,610 B1 | | 3/2002 | Yang |
| 6,362,958 B1 | | 3/2002 | Yu et al. |
| 6,414,845 B2 | * | 7/2002 | Bonet ......................... 361/695 |
| 6,459,575 B1 | * | 10/2002 | Esterberg ................... 361/687 |

* cited by examiner

Primary Examiner—Gregory D. Thompson
(74) Attorney, Agent, or Firm—Johnson & Associates, PC; Chauncey B. Johnson, Esq

(57) ABSTRACT

A heat dissipation connector capable of dissipating heat from electric appliances in relative close proximity, such as a personal computer and possesses one or more USB ports for connecting to other electrical appliances. Specifically, the present invention is provided with at least two USB ports. One USB port is capable of receiving electrical power supplied from a USB port of a connected electric appliance such as a personal computer for driving built-in fans of the present invention.

4 Claims, 5 Drawing Sheets

HEAT DISSIPATION CONNECTOR WITH USB PORT

FIELD OF THE INVENTION

This invention relates to a heat dissipation connector with at least two Universal Serial Bus (hereafter "USB") ports. Specially, this invention relates to a heat dissipation connector which is capable of using one USB port to obtain to electric power, direct current (hereafter "DC"), of 5V supplied from a USB port of a personal desk top computer (hereafter "PC") or a note book computer. The DC 5V obtained from the USB port of a PC or a notebook computer is used to drive DC fans located within the heat dissipation connector to dissipate heat from a connected appliance. The second USB port capable of transmitting speeds of up to 12 megabits per second, from which a total voltage of DC 5V is supplied, may be used to supply power to another connected appliance.

DESCRIPTION OF THE RELATED ART

It is well known that electrical appliances build up heat during operation. Heat and temperature that surpasses the critical operational level of electrical appliances are certain to have adverse consequences, if not lowered or dissipated. Excessive heat and temperature build up doing operation of electrical appliances constitute serious problems, such as premature fatigue of appliances component parts, reduction in overall operational efficiency and more often render these appliances completely inoperable.

Thus engineers have relentlessly endeavored to design cooling devices to solve the problem of appliance overheating. Cooling devices have been designed and used in central processing units (hereafter "CPU") of PC and notebook computer. For example, slim fans were developed to adhere to the top of CPU or directly built-in the CPU of a computer for cooling.

Due to insufficient spacing that exists within and around CPUs of computers, heat dissipation is not maximized using contemporaneous cooling devices. Built-in cooling devices or devices built to adhere to the top of CPUs resulting in limited and ineffective heat dissipation due to insufficient spacing.

Standard PC or notebook computers usually have one or more USB ports. For example, when a PC or a notebook have two USB ports, one of the latter may be used to provide speed transmission of up to 12 megabit per second to a connected device such as a printer, a scanner and the like. The second port may be used to supply low-level power of DC 5V to a connected device such as a keyboard, a mouse or the like.

Although, the beat dissipation connector uses a USB port from a connected electrical appliance, such as a PC or a notebook computer to obtain electrical power for the purpose of driving DC fans within the heat dissipation connector, the connected appliance benefits from effective and enhanced heat dissipation without sacrificing a USB port. This is because the heat dissipation connector of this invention is fitted with at least two USB ports, thereby maintaining the original total amount of USB ports accompanying the connected electrical appliance.

Accordingly, the heat dissipation connector of this invention is capable of using a USB port from a connected PC or a notebook computer for connecting to one of its USB ports, for supplying DC 5V and for driving internal DC fans responsible for dissipating heat from the connected device. In exchange, the heat dissipation connector of this invention makes available its non engaged USB port(s) to provide transmitting speed of up to 12 megabits per second to a connected device such as a printer, a scanner and the like or for supplying DC 5V for other use.

SUMMARY OF THE INVENTION

It is an object of the invention to disclose an external heat dissipation device with at least two USB ports capable of being connected to a USB port of an appliance, such as a PC or a notebook computer to provide heat dissipation when placed beside the appliance in use.

Another object of this invention is to disclose a heat dissipation connector without the need for AC/DC converters or DC/DC converters because electrical power of DC 5V is obtained from a USB port from a connected appliance, such as a PC or a notebook computer to drive the internal DC fans of the heat dissipation connector.

Still another object of this invention is to disclose an external USB port for connecting an appliance, such as a PC or a notebook computer, while using a second USB port for transmitting speed of 12 megabits per second for use by other appliances, or for supplying DC 5V for other use.

It is a further object of this invention to disclose a pair of U-shaped supports for supporting and directing heat dissipation of the heat dissipation connector when used in conjunction with an appliance, such as a PC or a notebook computer placed at a desirable distance.

Still, a further object of this invention is to disclose a heat dissipation connector without a U-shaped support capable of being directly placed on top of a connected appliance, such as a PC or a notebook computer to perform rapid heat dissipation if needed.

BRIEF DESCRIPTION OF THE DRAWINGS

Other aspects of this invention will become more apparent from the following detailed description when taken in conjunction with the conjunction with the accompanying drawings, in which.

DETAILED DESCRIPTION OF THE PREFERRED EMBODIMENTS

Figure 1:
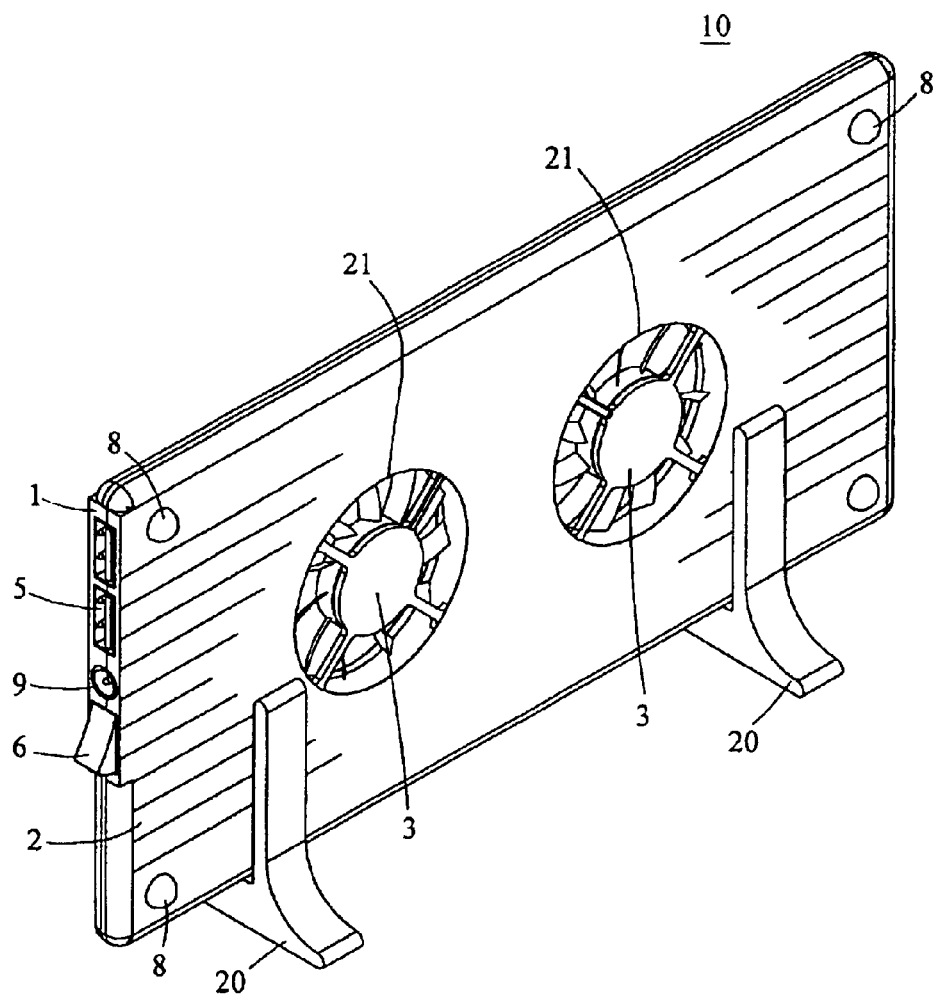
FIG. 1 Shows a heat dissipation connector of the present invention within a U-shaped support capable of placing an electrical appliance, such as a PC or a notebook computer placed at a desirable distance.

FIG. 1 shows a heat dissipation connector 10 of the present invention for use as an external heat dissipation device placed beside electrical appliances, such as a PC, note book computer or the like to enable the latter operate more normally by reducing overall operational heat accumulation. The heat dissipation device may possess two or more USB ports 5 for convenient connection of electrical appliances such as a printer, a scanner, a keyboard, and a mouse, etc.

One USB port of the heat dissipation connector is used as a power recipient from a connected appliance such as a notebook computer without the need for AC/DC converters or DC/DC converters. Simultaneously, the other USB port can be used to connect other electric appliances when using the heat dissipation device to dissipate heat from these appliances.

Figure 2:
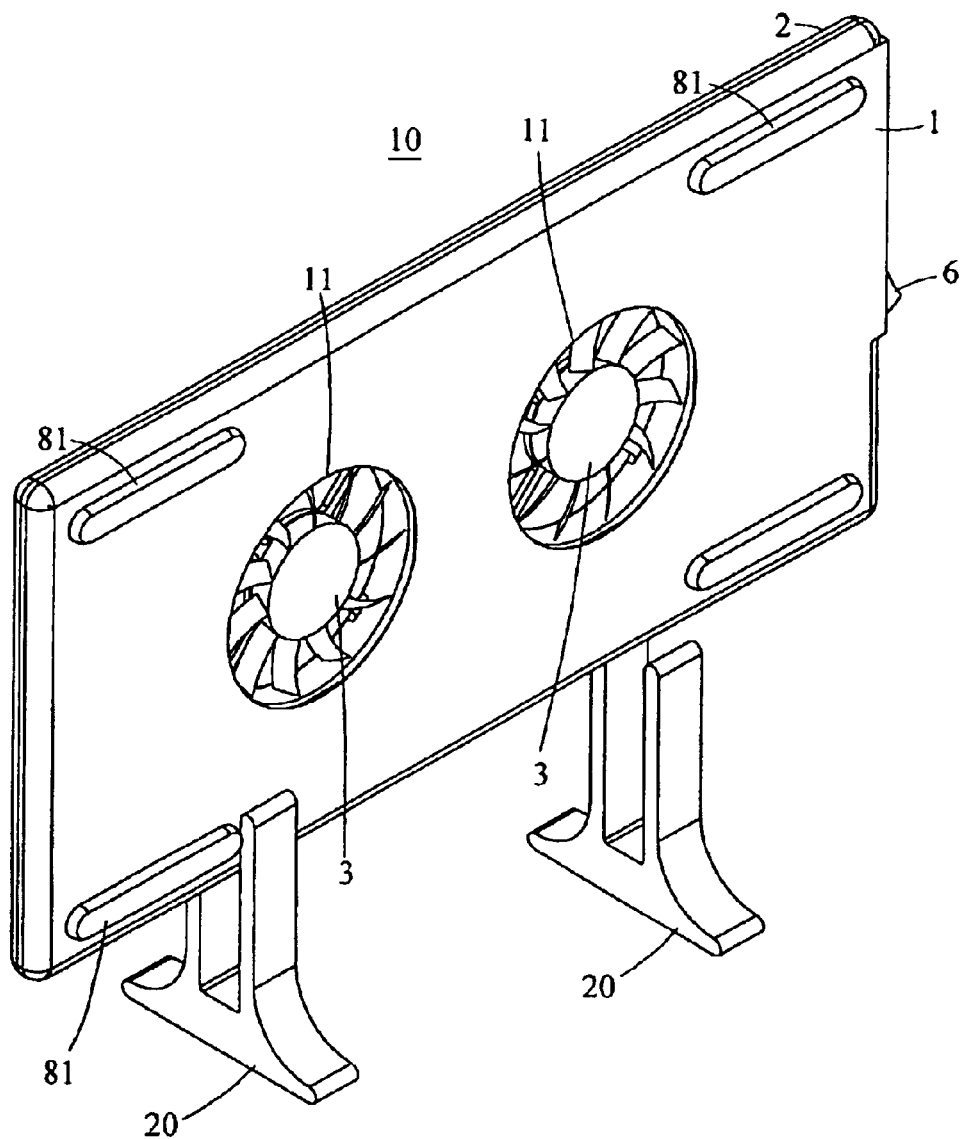
FIG. 2 Shows a back cover of the present invention having four positioning strips, which are used as spacers for securely positioning the invention within the U-shaped supports. The supports are removable if desired.
Figure 3:
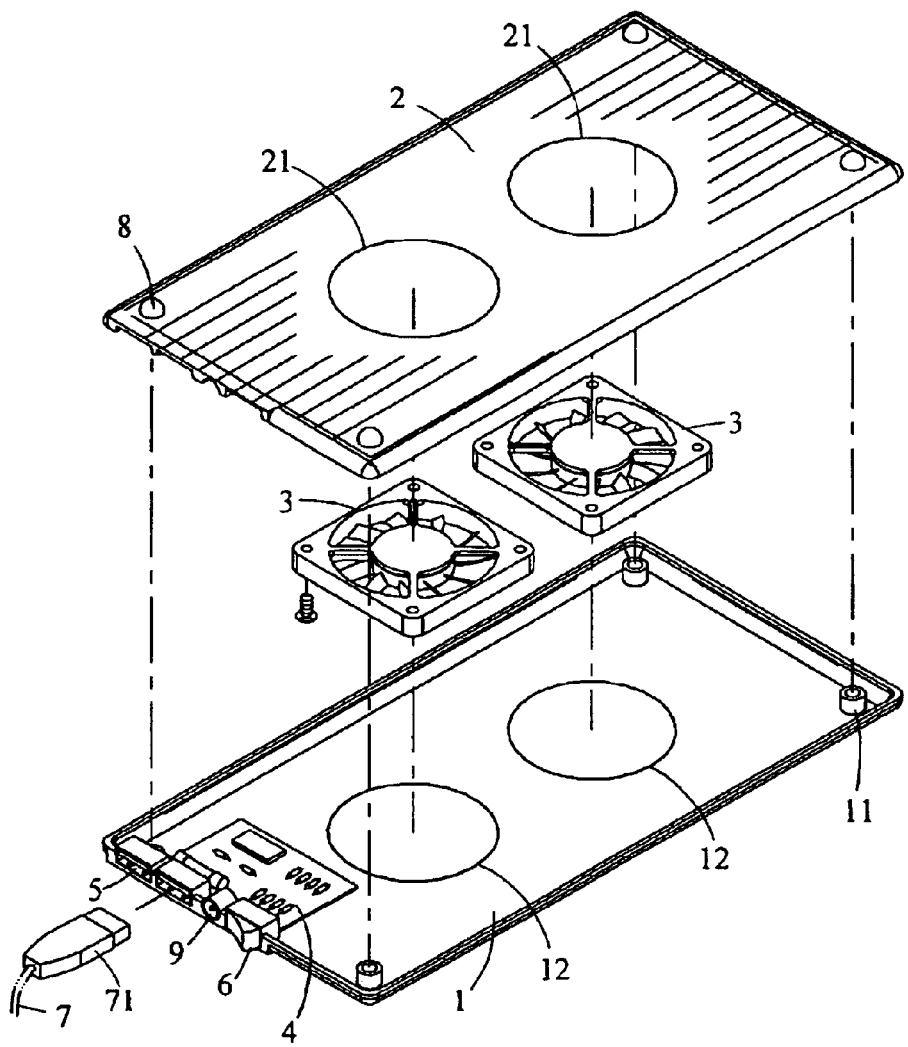
FIG. 3 Shows a sectional component drawing of a heat dissipation connector of the present invention.

FIG. 1 through FIG. 3, which represent a first embodiment of this invention, show a heat dissipation connector 10 and a pair of removable U-shaped supports 20 having a U-shaped recess. The removable U-shaped support is used for holistic insertion of the heat dissipation connector for use at a predetermined distance besides operational, electrical appliances to conduct heat dissipation.

The structure of the heat dissipation connector 10 comprises a front cover 2, which is a rectangle cover with four outwardly extended edges and provided with one or more air outlet openings 21 on its rectangular face. It is preferred to have two air outlet openings 21. A back cover 1, which is also a rectangle cover with four outwardly extended edges directly proportional to the front cover 2, and which has one or more air inlet openings 11 directly proportional to said air outlet openings 21 of said front cover 1. The back cover 1 has four positioning strips 81 one formed at each corner of its rectangular face used as spacer. Referring to FIG. 3, four bosses 11 are formed at inside corners of the back cover 1 used for connecting the back cover to the front cover.

A pair of removable U-shaped supports 20 having a U-shaped recess for holistic insertion of both the back cover 1 and the front cover 2 along the positioning strips 81 of the back cover 1 to securely hold the heat dissipation connector, and thereby providing for easy placement besides connected electrical appliances. One or more DC fans 3, which are driven by DC 5V are installed inside the front cover 2 with screws and positioned within the air outlet openings 21 of the front cover 2, so that the air outlet openings 21 of the DC fans are directly opposite the air inlet openings 11 of the back cover.

Still referring to FIG. 1 through FIG. 3, two or more USB ports 5 can be installed on the lateral ends of both the front cover 2 and the back cover 1. One USB port 5 is used for supplying power, DC 5V, to the DC fans 3 from an USB cable 7 and a USB plug 71 from an electric appliance, such as a PC shown in FIG. 4. The other USB port 5 is used for providing connective inlets for other appliances. An electronic control circuit boards 4 is installed inside the back cover 1 to control a USB port 5 benefiting from electric power of DC 5V supplied from connected appliances, such as a PC to drive the internal DC fans for heat dissipation purposes. The control circuit 4 shown in FIG. 3 also controls the other USB ports 5 of the present invention for transmitting speed of 12 megabits per second when connected to, for example, a printer or scanner, or when used for supplying power of DC 5V for other comparable use.

Figure 4:
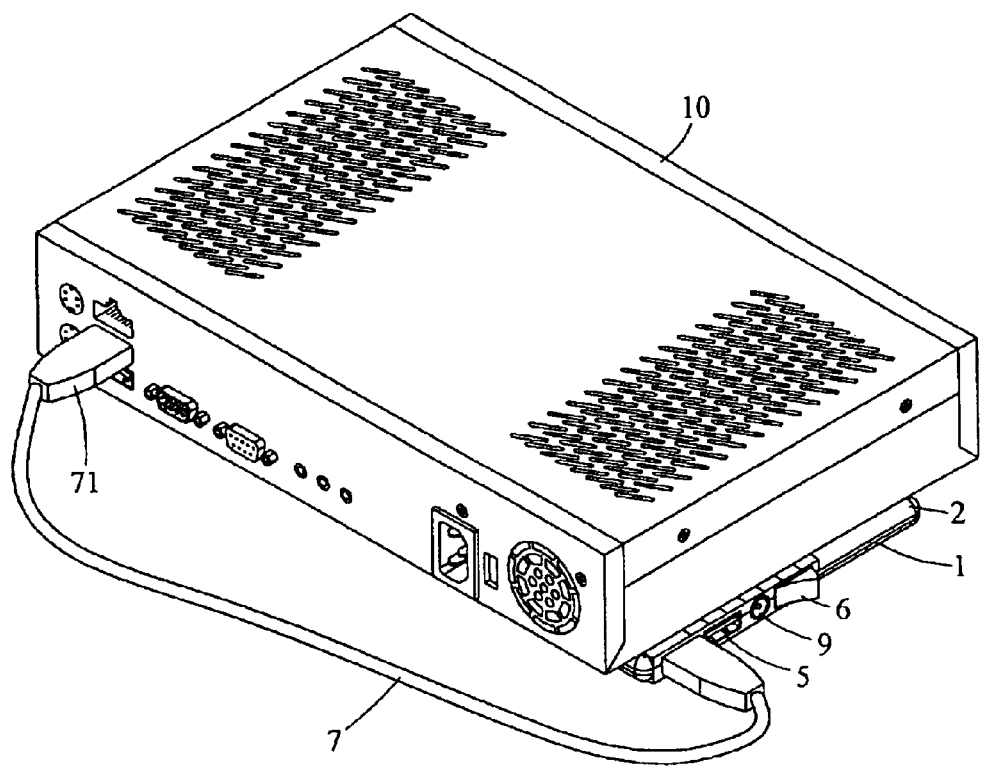
FIG. 4 Shows a PC's CPU directly connected to the heat dissipation connector of the present invention for purposes of rapid heat dissipation.
Figure 5:
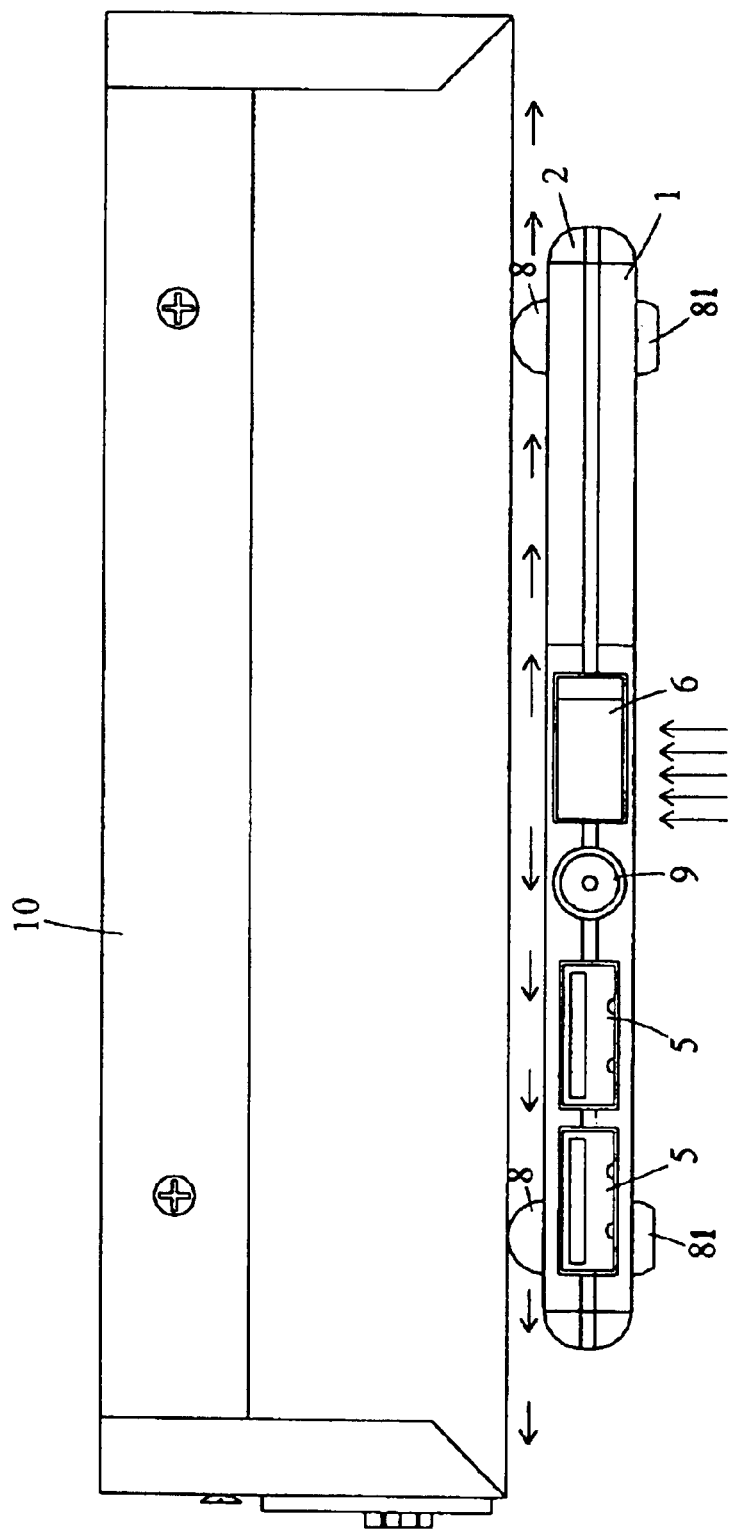
FIG. 5 Shows convective heat flow pattern during rapid heat dissipation when an electrical appliance, such as a PC's CPU is directly placed upon the heat dissipation connector of the present invention for purposes of rapid heat dissipation.

FIG. 4 and FIG. 5, which [[is the ]] a second embodiment of this invention, show a heat dissipation connector 10, without a pair of removable U-shaped supports 20, for placement at extremely close proximity or directly on electrical appliances, such as a PC or notebook computer for rapid or enhanced heat dissipation. The component parts of the heat dissipation connector 10 of this embodiment are identical to the description in the first embodiment, as shown in FIG. 1 through FIG. 3.

Specifically, referring to FIG. 4, USB cable 7 and plug 21 are used to provide power supply from a PC to the heat dissipation device through a USB port 5. The power supply obtained is used to rotate the fans to dissipate heat from the PC. As shown in FIG. 5, air is drawn into the air inlet openings 11 of the back cover 1 and the air is forcibly driven out from the air outlet openings 21 of the front cover 2 by the energized DC rotating fans. Heat dissipation is greatly enhanced by having nearly direct contact between the heat dissipation device and the PC as shown in FIG. 5 The other available USB port(s) of the device can be used for connecting devices, such as printers and scanners, etc. Again, no AC/DC or DC/DC converters are needed.

Still referring to FIG. 5, supporting blocks 8 positioned on the front cover 2 are used to support the weight of a PC and provide a desirable distance between the heat dissipation connector 10 and a PC during heat dissipation. When place directly on a flat surface, the positioning strips 81 of the back cover 1 can be used as supporting strips to provide a desirable distance between the heat dissipation connector and the surface when connected to an appliance. Such is distance is necessary for free flowing of air drawn in and driven out during enhance or rapid heat dissipation.

Finally, this invention is capable of being used in motor vehicle. Referring to FIG. 1 through FIG. 6, a control switch 6 may be used for switching on a DC 12V socket 9 capable of obtaining electric power supplied from a cigarette lighter of a motor vehicle. The power obtained may be used to supply DC 5V to rotate the heat dissipation connector's internal fans. Thus, the device of this invention may be used to circulate air within a vehicle while making available additional USB ports for other use.

It should be understood, however, that even though numerous characteristics and advantages of the present invention have been set forth in the foregoing description, the disclosure is illustrative only and changes may be made in the description within the principles of the invention to the full extent indicated by the broad general meaning of the terms in which the appended claims are expressed.

What I claim is:

1. A heat dissipation connector comprising:

a rectangular front cover with four outwardly extended edges and air outlet openings on the face of the rectangular front cover;

a rectangular back cover with four outwardly extended edges and air inlet openings on the face of the rectangular back cover;

the air inlet openings on the back cover are designed and positioned to oppositely correspond to the air outlet openings on the front cover, and the back cover has four positioning strips one formed at each corner of the rectangular face of the back cover for use as spacers;

a pair of U-shaped supports each positioned against a pair of positioning strips on the back cover to securely position the front cover and the back cover upright;

DC fans positioned within the air outlet openings of the front cover so that the air outlet openings of the front cover are directly opposite to the air inlet openings of the back cover;

at least two USB ports installed on lateral ends of both the front cover and the back cover, wherein one of the USB ports is used to supply 5 DC volts from a USB cable to the DC fans;

an electronic control circuit board installed inside the back cover for controlling one USB port, for providing 5 DC volts supplied from a connected appliance, for driving DC fans used for dissipating heat, for controlling the other USB port used for transmitting speed of 12 megabits per second and for supplying 5 DC volts for other use.

2. The heat dissipation connector according to claim 1, wherein the front cover is provided with two air outlet openings, the back cover is provided with two air inlet openings oppositely positioned and directly corresponding to the opening of the front cover, and two fans relatively positioned between the opposite openings of the front cover and the back cover.

3. The heat dissipation connector according to claim 1 or claim 2 further comprising a 12 DC socket and a switch, wherein the socket is capable of supplying 12 DC volts from a cigarette lighter of a motor vehicle when the switch is turned on, and the 12 DC volts are converted to 5 DC volts by the electronic control circuit board.

4. The heat dissipation connector according to claim 3, wherein four supporting blocks are positioned one on each corner of the rectangular face of the front cover.

* * * * *